United States Patent
Juengling

(10) Patent No.: US 8,357,601 B2
(45) Date of Patent: Jan. 22, 2013

(54) CROSS-HAIR CELL WORDLINE FORMATION

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 12/702,947

(22) Filed: Feb. 9, 2010

(65) Prior Publication Data
US 2011/0193172 A1 Aug. 11, 2011

(51) Int. Cl.
H01L 21/3205 (2006.01)
H01L 21/4763 (2006.01)
(52) U.S. Cl. .................................. 438/589; 438/689
(58) Field of Classification Search .................. 438/589
See application file for complete search history.

(56) References Cited

U.S. PATENT DOCUMENTS
2009/0014798 A1* 1/2009 Zhu et al. .................. 257/351
* cited by examiner Primary Examiner — Thien F Tran
(74) Attorney, Agent, or Firm — Fletcher Yoder

(57) ABSTRACT

Disclosed are methods and devices depicting fabrication of non-planar access devices having fins and narrow trenches, among which is a method that includes wet etching a conductor to form a recessed region and subsequently etching the conductor to form gates on the fins. The wet etching may include formation of recesses which are may be backfilled with a fill material to form spacers on the conductor. In some embodiments, portions of a plug may be removed during the wet etch to form overhanging spacers to provide further protection of the conductor during the dry etch.

14 Claims, 9 Drawing Sheets

CROSS-HAIR CELL WORDLINE FORMATION

BACKGROUND

1. Field of Invention

Embodiments of the invention relates generally to electronic devices, and more specifically, to non-planar transistors and techniques for fabricating the same.

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Fin field effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively energizing the gate.

High aspect ratio fins typically are desirable but challenging to construct. Generally, high aspect ratio finFETS can be integrated into a small area of the substrate, thereby potentially reducing manufacturing costs on a per-transistor basis. To increase density of the transistors, the width of each fin, and the gap between each fin, may be reduced. As the dimensions of the fin structures and the space between each fin are reduced, construction of gates or other structures of the fins may be increasingly difficult.

DETAILED DESCRIPTION OF SPECIFIC EMBODIMENTS

Some of the subsequently discussed embodiments may facilitate the manufacture of high aspect ratio structures, such as finFETs. As is described in detail below, during manufacture of the finFET, a hollow region may be formed during etch of the sidewalls of the fins. An oxide or other suitable material may be formed in the hollow region to isolate portions of the transistor from a substrate. The resulting structures may form a floating body cell in the body of the fin. The following discussion describes devices and process flows in accordance with embodiments of the present technique.

Figure 1:
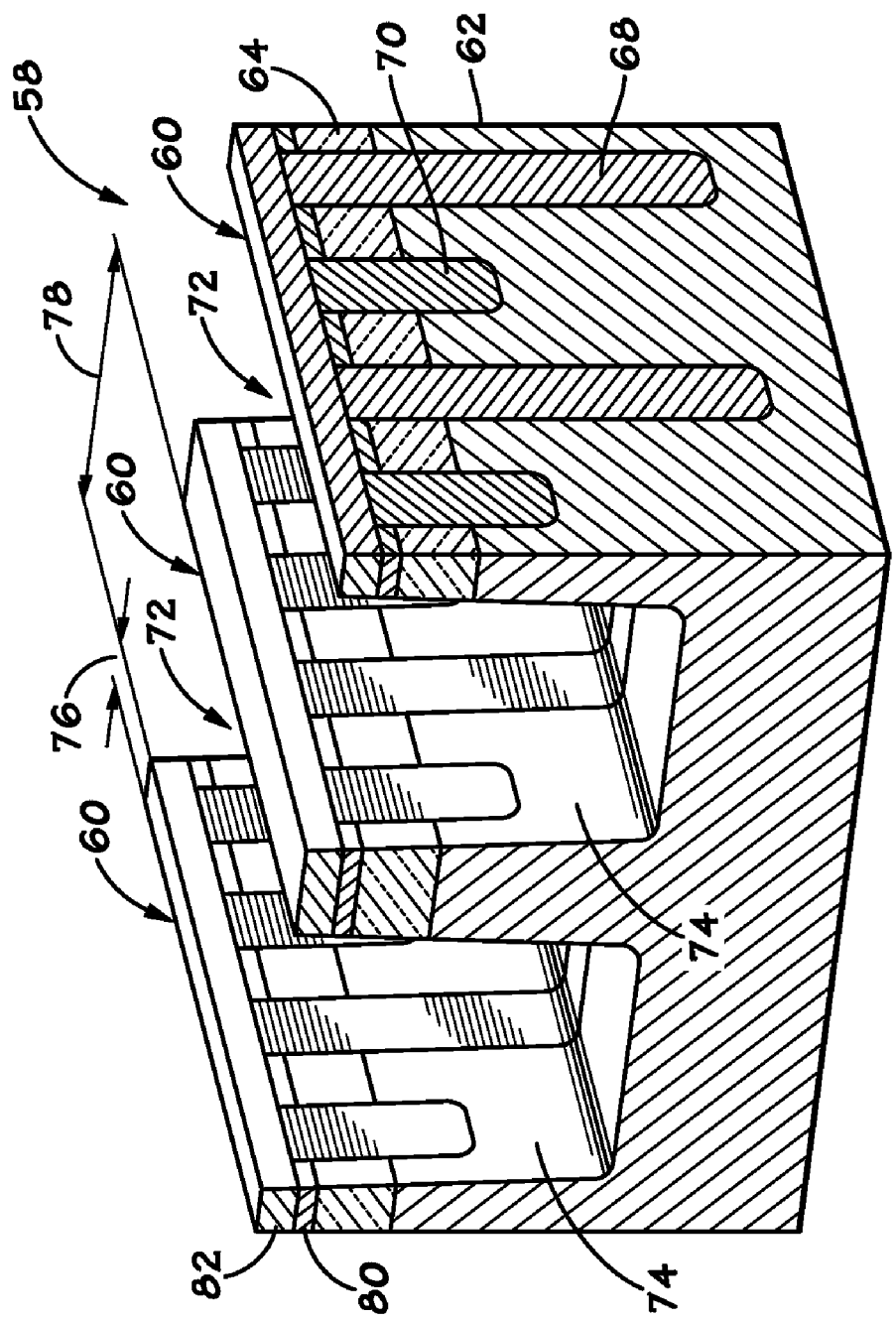
FIGS. 1-9 depict an embodiment of a process for forming an array of transistors.

FIG. 1 depicts a cross-sectional plane view of a portion 58 of a memory array comprising high aspect ratio structures, e.g., fins 60, in accordance with an embodiment of the present invention. The high aspect ratio structures 60 may be formed in and on a substrate 62 having an upper doped region 64 and a lower doped region 66 formed in the substrate 60 by any suitable processes. The substrate 100 may include semiconductive materials such as single crystalline or poly crystalline silicon, gallium arsenide, indium phosphide, or other materials with semiconductor properties. Alternately, or additionally, the substrate 62 may include a non-semiconductor surface on which an electronic device may be constructed such as a plastic or ceramic work surface, for example. The substrate 62 may be in the form of a whole wafer, a portion of a diced wafer, or a portion of a diced wafer in a packaged electronic device, for instance.

The upper doped region 64 and the lower doped region 66 may be differently doped. For example, the upper doped region 64 may be an n+ material and the lower doped region 66 may be a p− material (referred to as a "p-well"). The depth of the upper doped region 64 may be generally uniform over a substantial portion of the substrate 62, such as throughout a substantial portion of an array area of a memory device, for example. The upper doped region 64 and lower doped region 66 may be formed by implanting or diffusing dopant materials. Alternatively, or additionally, one or both of these regions 64 and/or 66 may be doped during growth or deposition of all or part of the substrate 62, such as during epitaxial deposition of a semiconductive material or during growth of a semiconductive ingot from which wafers may be cut. As is explained below, the upper doped region 64 may form a source and a drain of an access device, e.g., a transistor, and the lower doped region 66 may form a channel of an access device, e.g., a transistor.

The array portion 58 may include deep isolation trenches 68 and shallow trenches 70 that may be formed in the substrate 62. These trenches 68 and 70 may generally extend in the y-direction, as indicated in FIG. 1. The deep isolation trenches 68 generally separate access devices, e.g., transistors, formed in the high aspect ratio structures, and the shallow trenches 70 generally separate the source and drain of such access device. One or more shallow trenches 70 may be interposed between pairs of the deep isolation trenches 68. In some embodiments, the shallow trenches 70 may be deeper than the upper doped region 64 to separate subsequently formed sources and drains. Additionally, the deep isolation trenches 68 may be deeper than the shallow trenches 70 to isolate subsequently formed access device, e.g., transistors. The deep isolation trenches 68 and/or shallow trenches 70 may have a generally rectangular or trapezoidal cross-section, and, in some embodiments, their cross-section may be generally uniform through some distance in the x-direction, for example through a distance larger than one, two, five, or more transistor lengths. The deep isolation trenches 68 and shallow trenches 70 may be partially or entirely filled with various dielectric materials, such as high density plasma (HDP) oxide, for instance, to electrically isolate features. Additionally, the deep isolation trenches 68 and/or shallow trenches 70 may include various liner materials, such as silicon nitride for example, to relieve film stresses, improve adhesion, and/or function as a barrier material.

The fins 60 may be formed in substrate 62 and separated via row trenches 72, forming sidewalls 74 on either side of each fin 60. The row trenches 72 may be formed by any suitable process. For example, in an embodiment, the row trenches 72 may be formed in the substrate 62 through use a mask, sub-photolithographic techniques, any suitable etching, or combination thereof.

The fins 60 may define regions having a width 76 and the row trenches 72 may define regions having a width 78. In some embodiments, the row trenches 72 may be formed using a mask with a sub-photolithographic process, e.g., a sidewall-spacer process, a resist-reflow process, or a line-width thinning process. The widths 76 and 78 may be generally equal to or less than F, ¾ F, or ½ F. In one embodiment, the width 76 of the fins 60 may be about 60 nanometers, 50 nanometers, or less, and the width 78 of the row trench 72 may be about 20 nanometers or less.

The fins 60 may include one or more materials above upper doped region 64. For example, as shown in FIG. 1, the fin 60 may include a pad oxide cap 80 and a silicon nitride cap 82. The pad oxide cap 80 and silicon nitride cap 82 may be formed from pad oxide and silicon nitride respectively during etch of the row trenches 72 and formation of the fins 60.

Figure 2:
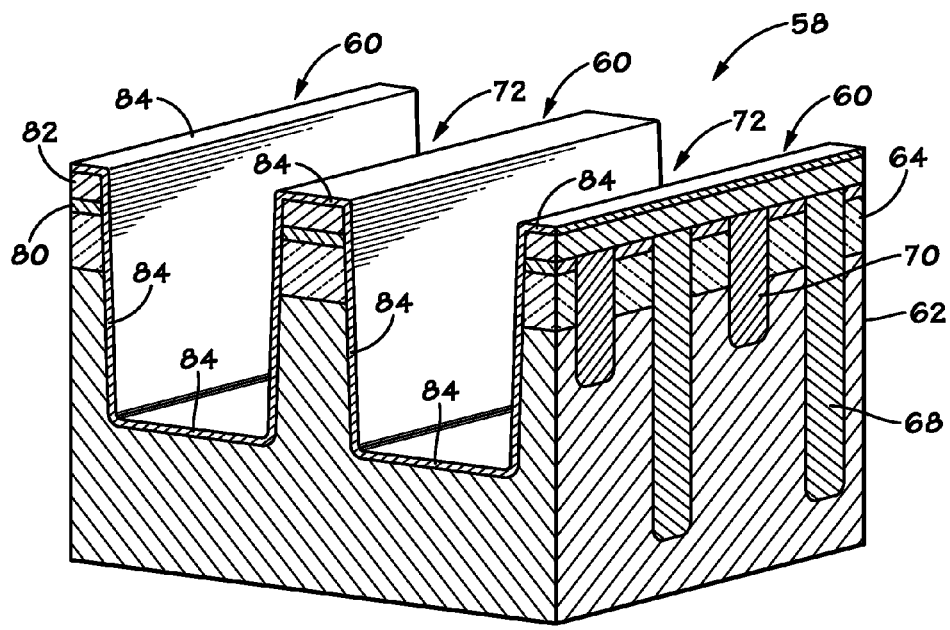

As shown in FIG. 2, a gate oxide 84 may be formed on the walls 74 of the fins 60 and bottom portion 80 of the trenches 70. The gate oxide 84 may be deposited, grown, or otherwise formed, and it may substantially or entirely cover the exposed portions of the upper doped region 64 and the lower doped region 66. The gate oxide 84 may include a variety of dielectric materials, such as oxide (e.g., silicon dioxide), oxynitride, or high-dielectric constant materials like hafnium dioxide, zirconium dioxide, and titanium dioxide. The gate oxide 84 may have a thickness less than about 60 Å, e.g., a thickness equal to or less than about 40 Å.

Figure 3:
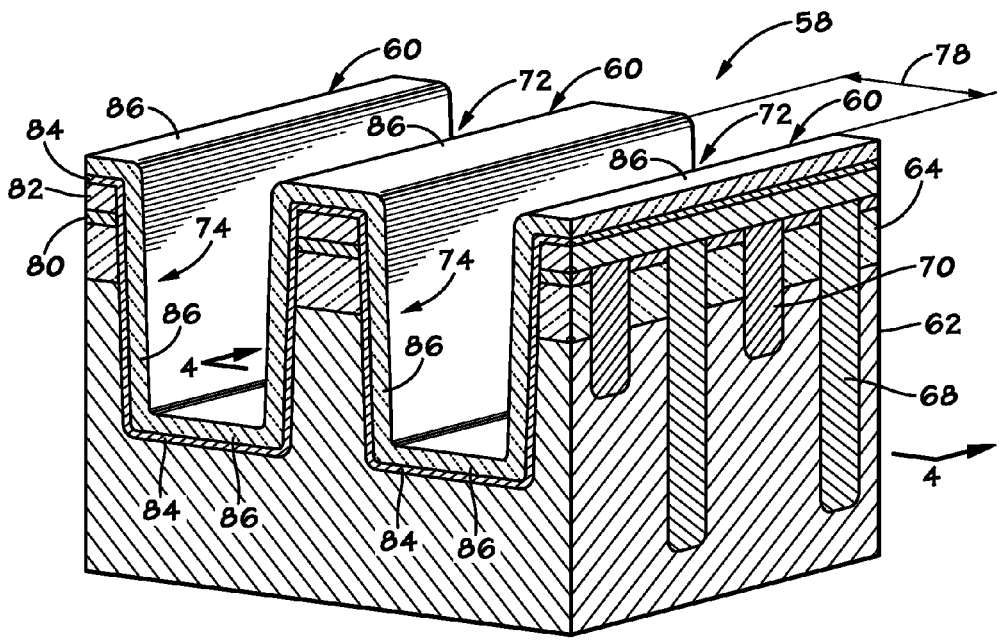

Next, in FIG. 3, a metal conductor 86 may be formed on the gate oxide 84 in accordance with an embodiment of the present invention. As shown in FIG. 3, the metal conductor 86 may be formed on the bottom 80 of the row trenches 72 and on the sidewalls 74 of the fins 60. The metal conductor 86 may include titanium nitride (TiN), tungsten nitride, ruthenium (Ru), or other appropriate conductive materials or combination thereof. For example, in one embodiment, titanium nitride may be disposed on the gate oxide 84, and tungsten nitride may be disposed on the titanium nitride to form the metal conductor 86. As discussed further below, etching of the metal conductor 86 may form active gates (e.g., wordlines) on the walls 74 of the fins 60. However, in some embodiments, the width 78 of the row trenches 72 may not be amenable to conventional etch processes to construct the active gates.

Figure 4:
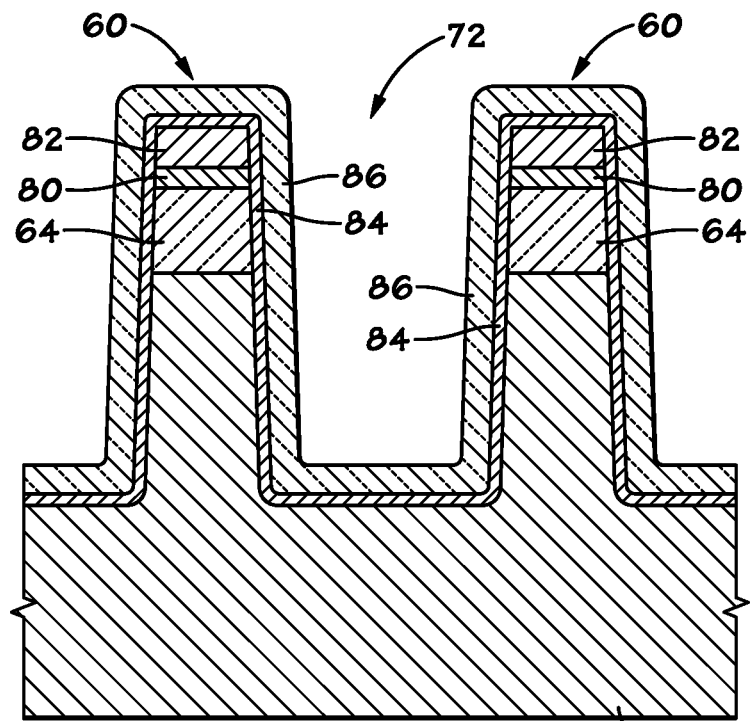

FIG. 4 is a front view oriented along line 4-4 of FIG. 3. As discussed above, each fin 60 may include a pad oxide cap 80 and a silicon nitride cap 82 disposed on the upper doped region 64 of the fin 60. As also described above, a gate oxide 84 may be formed on the fins 60 and row trenches 72, and a metal conductor 86 may be formed on the gate oxide 84.

Figure 5:
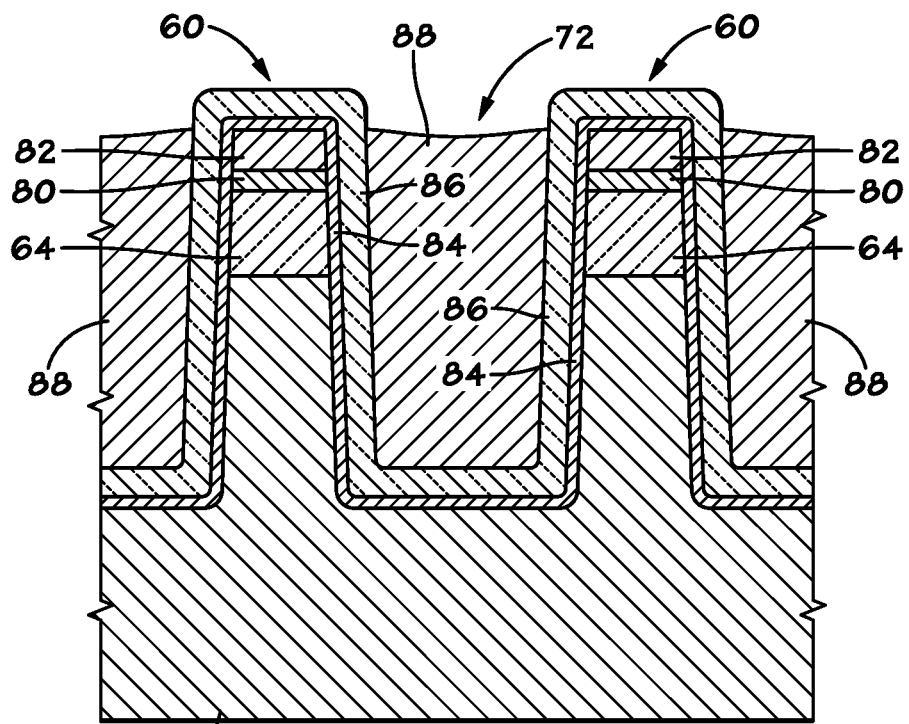

FIG. 5 depicts formation of a thick polysilicon 88 (also referred to as a "plug") on the array portion 58 in accordance with an embodiment of the present invention. The polysilicon 88 may be used to plug any spaces in the array portion 58, such as at the end of the array. The polysilicon 88 may be deposited or otherwise formed on the fins 60 and within row trenches 72. After deposition of the polysilicon 88, any excess of the polysilicon 88 may be removed to the metal conductor 86. In other embodiments, the polysilicon 88 may be removed back to the silicon nitride cap 82. The excess polysilicon 88 may be removed by dry etch, chemical mechanical planarization (CMP), or any suitable process.

Figure 6:
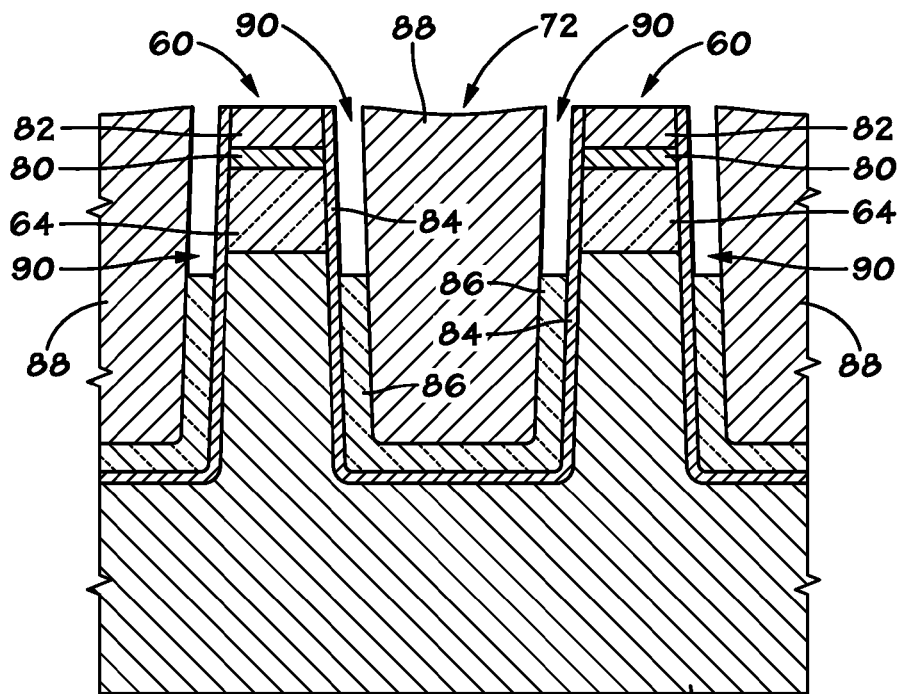

FIG. 6 depicts the array portion 58 after a removal of a portion of the metal conductor 86 in accordance with an embodiment of the present invention. As shown in FIG. 6, the metal conductor 86 may be removed on either side of the polysilicon 88 along the sidewalls 74 of the fins 60, forming hollow regions 90. The metal conductor 88 on either side of the polysilicon 88 may be removed by a wet etch, such as a wet TiN etch if the metal conductor 88 is TiN. The polysilicon 88 prevents further etching into the row trench 72. The duration of the wet etch may control the depth (e.g., distance) of the etch into the row trench 72. For example, in one embodiment the hollow regions 90 may be formed via an etch of about 60 nanometers from the top of the fin 60.

Figure 7:
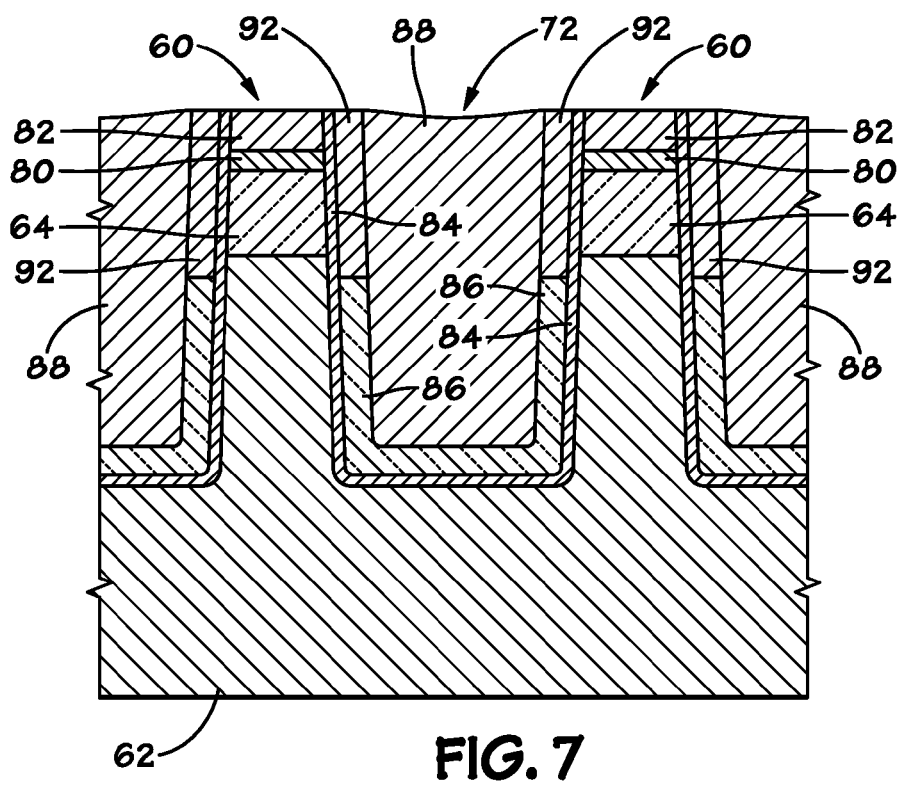

FIG. 7 depicts backfilling of the recesses 90 with a fill material 92 in accordance with an embodiment of the present invention. The fill material may be silicon nitride, aluminum oxide ($Al_2O_3$), a high temperature oxide (HTO), or any suitable dielectric material. As shown in FIG. 7, the fill material 90 extends into the recess 90 down to the metal conductor 86.

Figure 8:
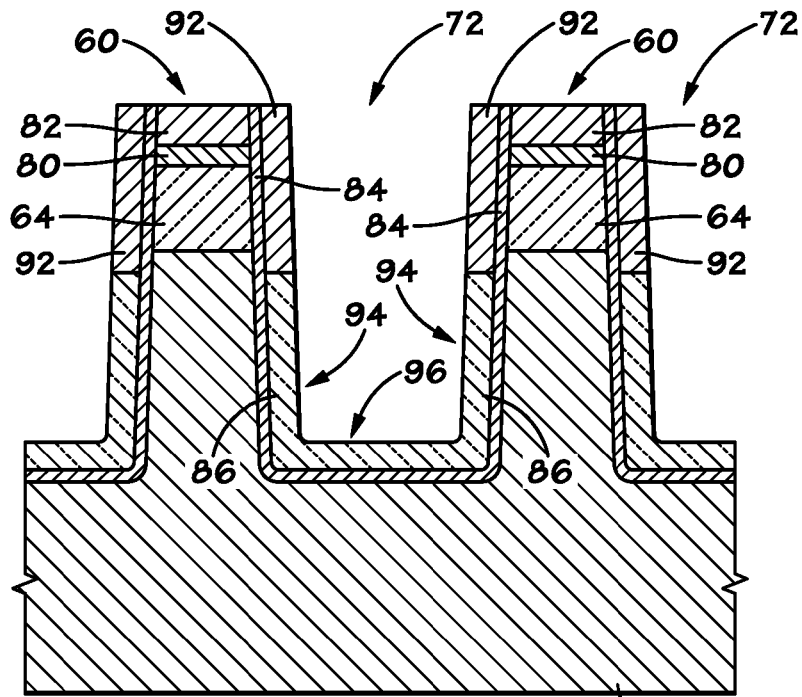

FIG. 8 depicts removal of the polysilicon 88 (e.g., plug) from the row trench 72 in accordance with an embodiment of the present invention. The polysilicon 88 may be removed by any suitable process. The top of the metal conductor 86 is protected by the fill material 92. After removal of the polysilicon 88, the sides 94 and bottom 96 of the metal conductor 86 in the row trench 72 are exposed for further processing. For example, in one embodiment, after more removal of the polysilicon 88 further processing may include implantation of a dopant, e.g., boron, on the bottom 96 in the row trench 72 for isolation.

Figure 9:
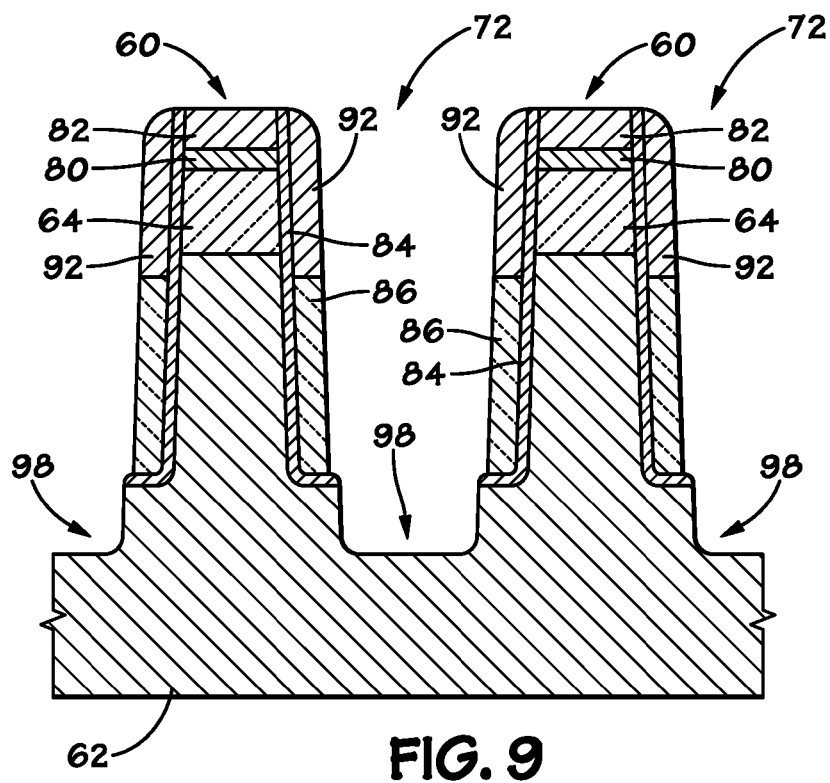

FIG. 9 depicts the array portion 58 after removal of the bottom 96 of the metal conductor 86 via, for example, a dry etch in accordance with an embodiment of the present invention. The metal conductor 86 may be removed by a dry spacer etch or any suitable process. As shown in FIG. 9, removing the bottom 96, the metal conductor 88 in the row trench 72 may form separate gates (e.g., wordlines) on the sidewalls of the fins 60. The etch that removes the metal conductor 86 may remove the metal conductor 86 down to the gate oxide 84, or, as shown in FIG. 9, may etch into the substrate 62 at the bottom of the row trench 72 as shown by dashed region 98. However, as shown in FIG. 9, in such an embodiment, the top of the fins 60 are protected by the silicon nitride cap 82 such that the etch of the metal conductor 88 does not etch into the fin 60 (although some portion of the silicon nitride cap 82 may be removed by the etch). It should be appreciated that the duration of the wet etch may be sufficient to remove the desired portion of the metal conductor 88 without excess removal of the sides 94 of the metal conductor 88 (which may be protected at the upper portions by the fill material 92).

Figure 10:
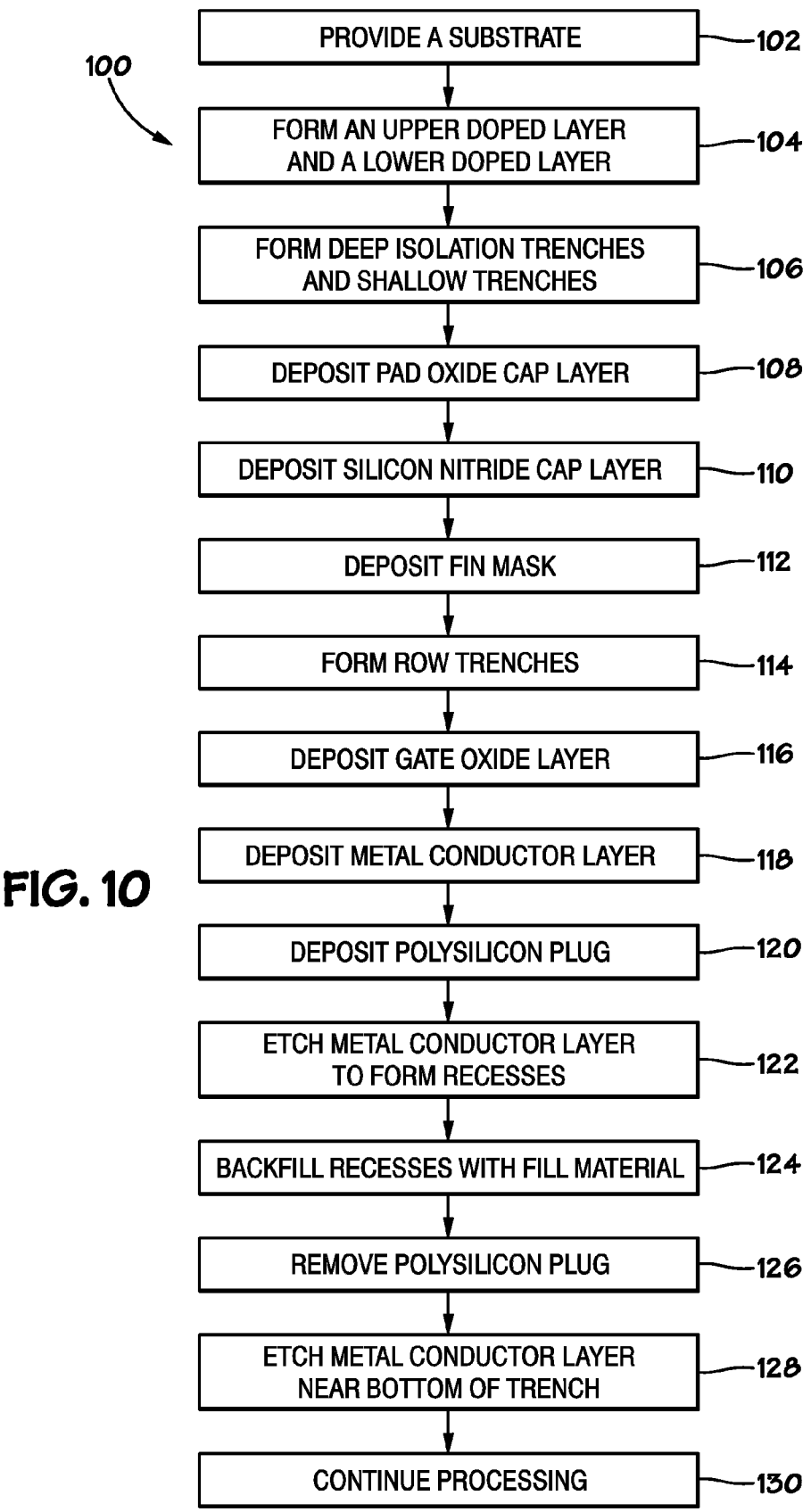
FIG. 10 is a flowchart depicting the manufacturing process of FIGS. 1-12 in accordance with an embodiment of the present invention.

FIG. 10 depicts an embodiment of a manufacturing process 100, including the techniques described above and illustrated in FIGS. 1-9, that may be used to manufacture a finFET array or other high aspect ratio structures in accordance with an embodiment of the present invention. With reference to FIG. 10, the manufacturing process 100 may begin with providing a substrate 62, as depicted by block 102. The substrate 62 may include any of the materials discussed in reference to the substrate 62 in FIG. 1. Additionally, the substrate 62 may include formation of the upper doped region 64 and a lower doped region 66, as depicted by block 104 in FIG. 10. It should be noted that the step depicted by block 104, like many of the steps in the manufacturing process 100, may be performed in a different sequence than that depicted by FIG. 10.

Deep isolation trenches 68 and shallow trenches 70 may be formed in the substrate 62, as depicted by block 106 in FIG. 10. Additional materials may be deposited on the substrate 62 to form caps on the fins after they are formed in the substrate 62. For example, a pad oxide may be deposited on the substrate 62, as shown in block 108, to eventually form the pad oxide caps 80. Similarly, silicon nitride may be deposited on the substrate 62, as shown in block 110, to form the silicon nitride caps on the fins 60.

The manufacturing process 100 may include depositing or growing a fin mask, as depicted by block 112 in FIG. 10. Next in the manufacturing process 100, row trenches 72 may be formed, as depicted by block 114 in FIG. 9, by any suitable process, such as anisotropic etch. As discussed above, formation of the row trenches 72 generally defines the bottom 80 of the row trenches 72 and the sidewalls 74 of the fins 60. After formation of the fins 60 and row trenches 72, the gate oxide 84 may be deposited on the fins 60 and row trenches 72, as shown in block 116 and illustrated in FIG. 2. After deposition of the gate oxide 84, the metal conductor 86 may be deposited on the trenches 72 and fins 60 as shown in block 118 and illustrated above in FIG. 3.

Next, the polysilicon plug may be formed in the row trenches 72, as shown in block 120 and illustrated above in FIG. 5. As mentioned above, the polysilicon 88 may be etched to the metal conductor 86 or other level to form the plug in the row trenches 72. As shown in block 122, the metal conductor 86 may be etched on either side of the polysilicon plug to form the recesses 90 adjacent to the sidewalls 74 of the fins 60, as illustrated in FIG. 6. Next, in block 124, after formation of the recesses 90, the recesses 90 may be backfilled with the fill material 90, as illustrated in FIG. 7.

Next, as shown in block 126 and illustrated in FIG. 8, the polysilicon plug 126 may be removed, exposing the bottom 90 and sides 94 of the metal conductor 86 in the row trench 72. To form separate gates (e.g., wordlines) disposed on the sidewalls 74 of the fins 60, the metal conductor 86 may be etched at the bottom 90 of the row trench 72, removing the metal conductor 86, as shown in block 128 and illustrated above in FIG. 9. After formation of the wordlines, the array may be subjected to further processing, as shown in block 130.

Figure 11:
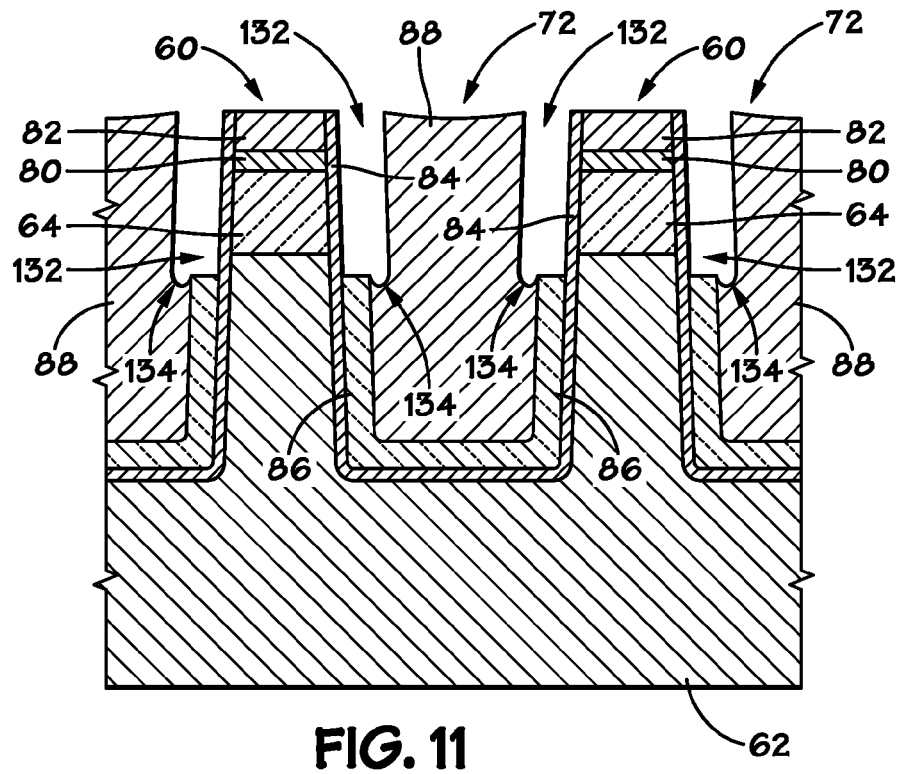
FIGS. 11-13 depicts another embodiment of a process for forming an array of transistors.

FIG. 11 depicts an alternate embodiment of the cross-section of the array portion 58 after formation of an overhanging spacer to provide further protection of the metal conductor 88 during formation of the gates (e.g., wordlines). The overhanging spacers may be formed during or after a wet etch of the metal conductor 86, e.g., after deposition of the polysilicon 88 in FIG. 5, in the process flow. As shown in FIG. 11, an etch, e.g., a wet etch or other etch process, may be performed at a sufficient duration to cause the polysilicon 88 to recess slightly, forming overhanging regions 134 that extend over the metal conductor 86. The overhanging regions 134 may aid in protecting the sidewall of the later formed gates (e.g., wordlines) during subsequent processing, such as during the etch of the metal conductor 86.

Figure 12:
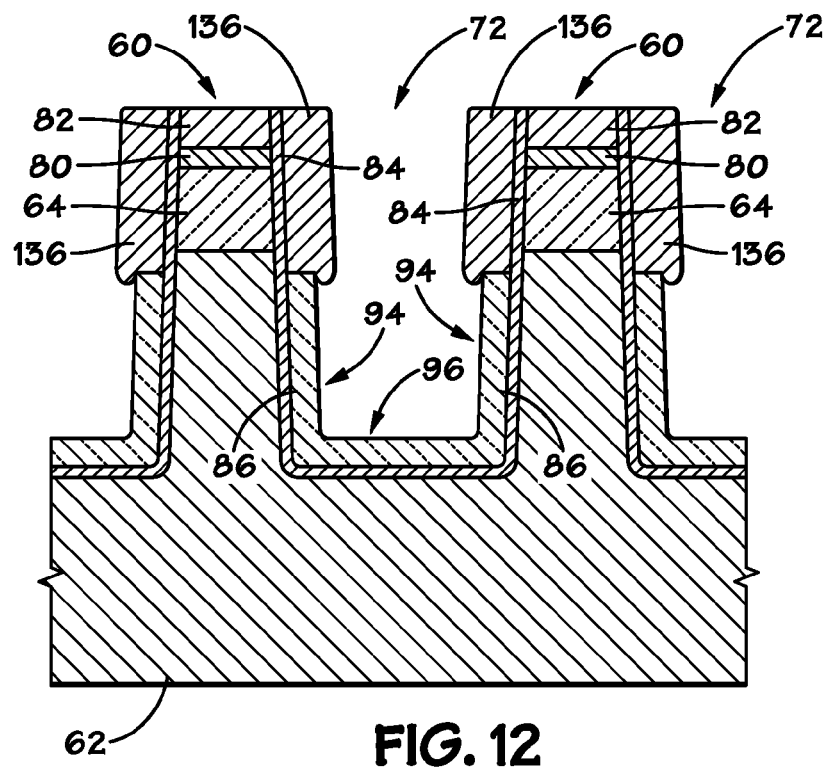

FIG. 12 depicts the recesses backfilled with the fill material 92 and removal of the polysilicon 88 in accordance with an embodiment of the present invention. As mentioned above, the fill material 92 may be silicon nitride, Al2O3, HTO, or any suitable material. As shown in FIG. 12, when deposited in the recesses 132, the fill material 92 fills the overhanging regions 134 to construct the overhanging protective spacers 136.

Figure 13:
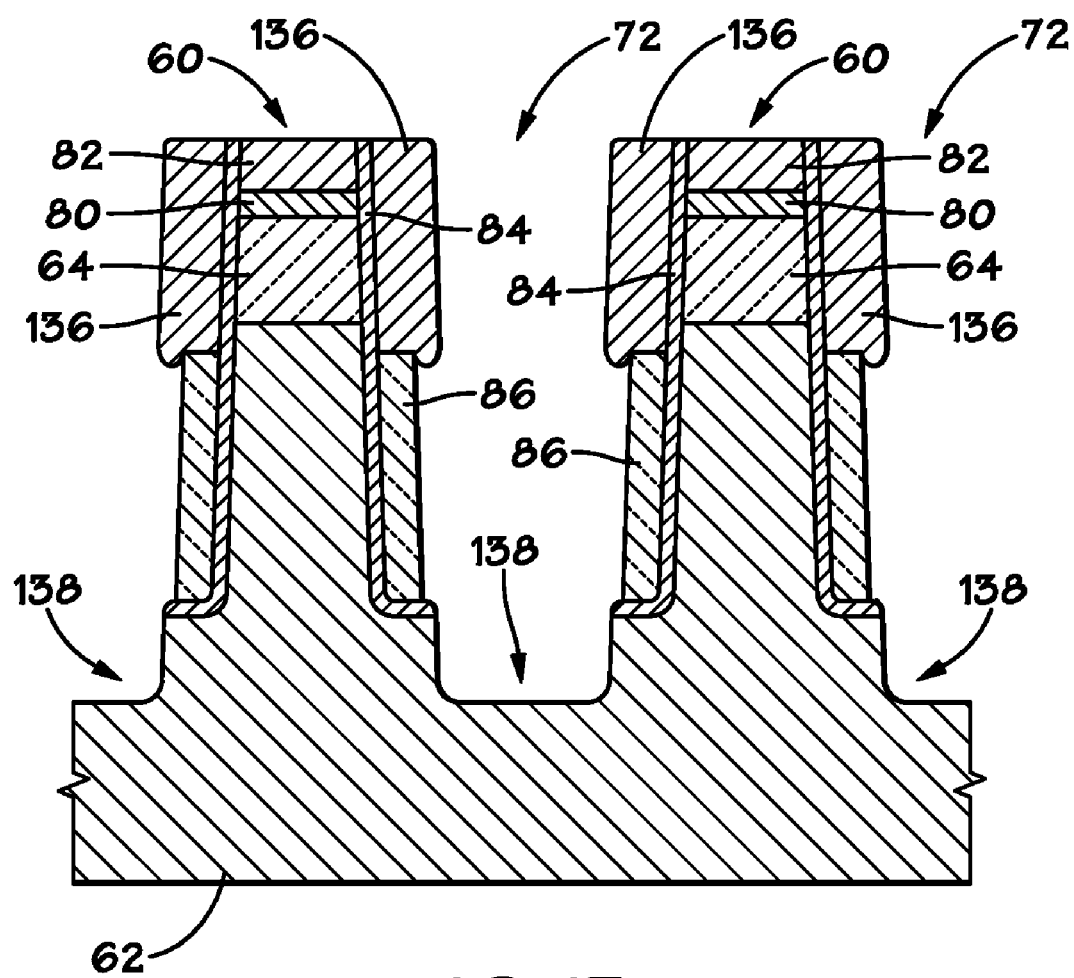

FIG. 13 depicts the array portion 58 after removal of the bottom 96 of the metal conductor 86 via a dry etch in accordance with an embodiment of the present invention. The metal conductor 86 may be removed by a spacer etch or any suitable process. As shown in FIG. 13, removing the bottom 96 the metal conductor 88 in the row trench 72 may form separate gates (e.g., wordlines) on the sidewalls 74 of the fins 60. The overhanging protective spacers 136 may aid in protecting the sides 94 of the metal conductor regions from undesirable etching by the dry etch process, providing better formation of the wordlines. The dry etch process may remove the metal conductor 86 down to the gate oxide 84, or as shown in FIG. 13, may etch into the substrate 62 at the bottom of the row trench 72 as shown by dashed region 138. As mentioned above, the top of the fins 60 are protected by the silicon nitride cap 82 such that the etch of the metal conductor 86 does not etch into the fin 60 (although some portion of the silicon nitride cap 82 may be removed by the etch).

Figure 14:
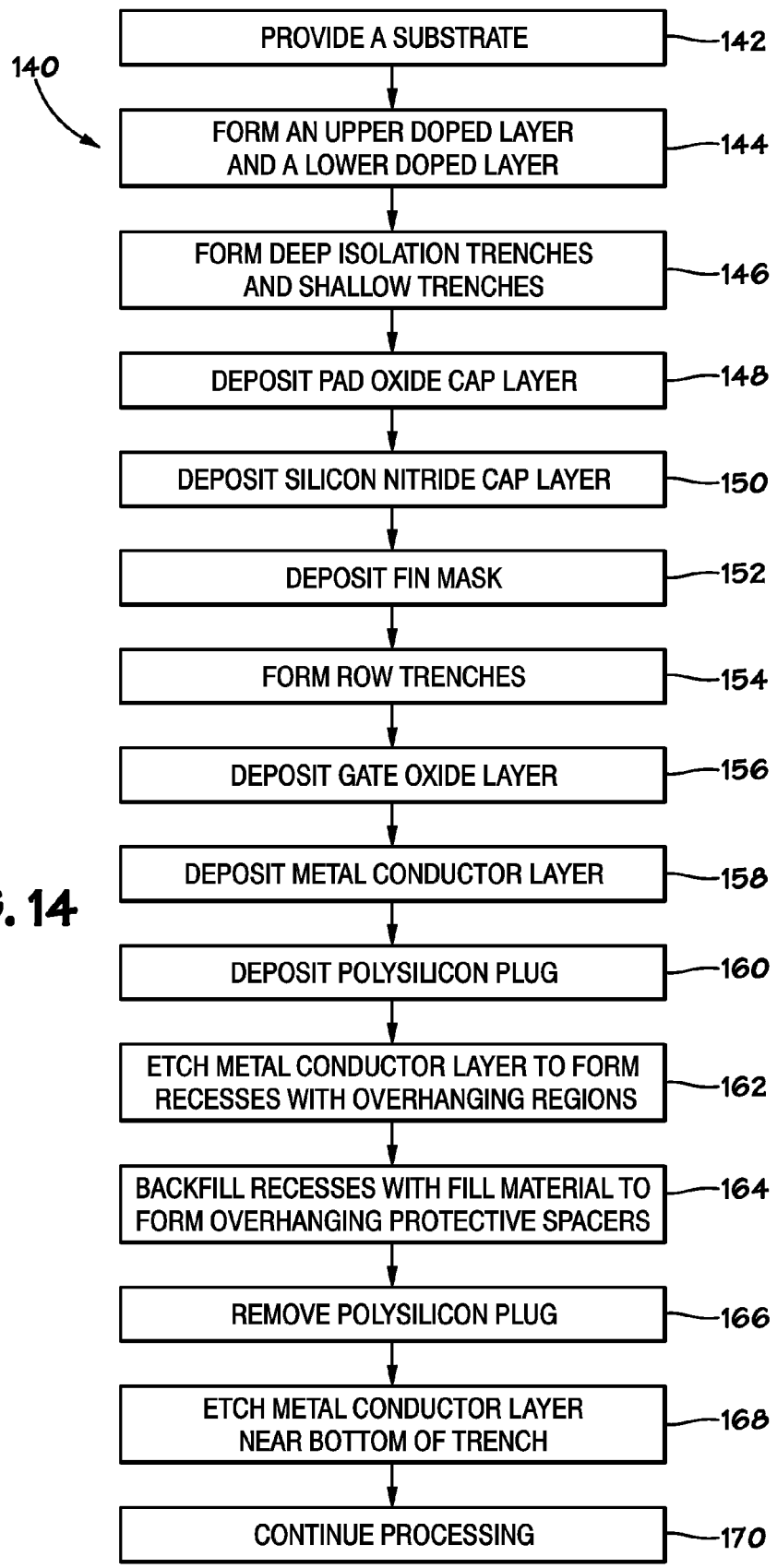
FIG. 14 is a flowchart depicting the manufacturing process of FIGS. 11-13 in accordance with an embodiment of the present invention.

FIG. 14 depicts an embodiment of a manufacturing process 140, including the techniques described above and illustrated in FIGS. 11-13, that may be used to manufacture a finFET array or other high aspect ratio structures in accordance with an embodiment of the present invention. With reference to FIG. 14, the manufacturing process 140 may begin with providing a substrate 62, as depicted by block 142. The substrate 62 may include any of the materials discussed in reference to the substrate 62 in FIG. 1. Additionally, the substrate 62 may include formation of the upper doped region 64 and a lower doped region 66, as depicted by block 144 in FIG. 14. It should be noted that the step depicted by block 144, like many of the steps in the manufacturing process 140, may be performed in a different sequence than that depicted by FIG. 14.

Deep isolation trenches 68 and shallow trenches 70 may be formed in the substrate 62, as depicted by block 146 in FIG. 14. Additional materials may be deposited on the substrate 62 to form caps on the fins after they are formed in the substrate 62. For example, a pad oxide may be deposited on the substrate 62, as shown in block 148, to eventually form the pad oxide caps 80. Similarly, silicon nitride may be deposited on the substrate 62, as shown in block 150, to form the silicon nitride caps on the fins 60.

The manufacturing process 140 may include depositing or growing a fin mask, as depicted by block 152 in FIG. 14. Next in the manufacturing process 140, row trenches 72 may be formed, as depicted by block 154 in FIG. 14, by any suitable process, such as anisotropic etch. As discussed above, formation of the row trenches 72 generally defines the bottom 80 of the row trenches 72 and the sidewalls 74 of the fins 60. After formation of the fins 60 and row trenches 72, the gate oxide 84 may be deposited on the fins 60 and row trenches 72, as shown in block 156 and illustrated in FIG. 2. After deposition of the gate oxide 84, the metal conductor 86 may be deposited on the trenches 72 and fins 60 as shown in block 158 and illustrated above in FIG. 3.

Next, the polysilicon plug may be formed in the row trenches 72, as shown in block 160 and illustrated above in FIG. 5. As mentioned above, the polysilicon 88 may be etched to the metal conductor 86 or other level to form the plug in the row trenches 72. As shown in block 162, the metal conductor 86 may be dry etched on either side of the polysilicon plug to form the recesses 132 having overhanging regions 134 extending over the metal conductor 86, as illustrated in FIG. 11. Next, in block 164, after formation of the recesses 90, the recesses 90 may be backfilled with the fill material 90 to from overhanging protective spacers 136, as illustrated in FIG. 12.

Next, as shown in block 166 and illustrated in FIG. 8, the polysilicon plug 126 may be removed, exposing the bottom 90 and sides 94 of the metal conductor 86 in the row trench 72. To form separate gates (e.g., wordlines) disposed on the sidewalls 74 of the fins 60, the metal conductor 86 may be etched at the bottom 90 of the row trench 72 using the overhanging protective spacers 136, removing the metal conductor 86, as shown in block 168 and illustrated above in FIG. 13. After formation of the wordlines, the array may continue on for further processing, as shown in block 170.

What is claimed is:
1. A method of fabricating an access device, comprising:
    forming a first sidewall of a first fin, the first sidewall extending in a first direction;
    forming a second sidewall of a second fin, the second sidewall extending in the first direction, wherein the first sidewall and second sidewall generally define a trench having a bottom surface;

depositing a gate oxide on the first sidewall, second sidewall, and bottom surface;

depositing a conductor on the gate oxide;

depositing a plug in the trench;

etching the conductor to form one or more recesses between the plug and the first sidewall, or the second sidewall, or a combination thereof;

filling the recesses with a fill material; and spacer etching the conductor to form separate wordlines on each of the first sidewall and the second sidewall.

2. The method of claim 1, comprising removing the plug.

3. The method of claim 1, wherein depositing the plug in the trench comprises depositing a polysilicon.

4. The method of claim 1, wherein the conductor comprises titanium nitride, tungsten nitride, or a combination thereof.

5. The method of claim 1, wherein the fill material comprises a nitride, aluminum oxide, or a high temperature oxide.

6. The method of claim 1, comprising implanting boron on the bottom surface of the trench.

7. The method of claim 1, wherein etching the conductor comprises etching the conductor comprises etching the conductor to form one or more recesses to form overhanging regions.

8. The method of claim 7, wherein filling the recesses comprises filling the overhanging regions with a fill material to form overhanging spacers.

9. A method of fabricating a transistor, comprising:

forming a wordline on a sidewall of a fin, comprising:

etching a first material on a first portion of the sidewall of the fin;

forming a protective spacer above the first portion; and spacer etching the first material to separate a first section of the first material from a second section of the first material to form the wordline.

10. The method of claim 9, wherein etching a first material comprises wet etching the first material.

11. The method of claim 9, wherein forming a protective spacer comprises filling a recess on the first portion of the sidewall with a fill material.

12. The method of claim 9, wherein the first material comprises titanium nitride, tungsten nitride, or a combination thereof.

13. The method of claim 9, wherein the width of the fin comprises 60 nanometers or less.

14. The method of claim 9, wherein dry spacer etching the first material comprises dry spacer etching a second material disposed under the first material.

* * * * *

UNITED STATES PATENT AND TRADEMARK OFFICE
CERTIFICATE OF CORRECTION

PATENT NO. : 8,357,601 B2
APPLICATION NO. : 12/702947
DATED : January 22, 2013
INVENTOR(S) : Werner Juengling It is certified that error appears in the above-identified patent and that said Letters Patent is hereby corrected as shown below:

In column 7, line 22, in Claim 7, before "etching" delete "etching the conductor comprises".

Signed and Sealed this
Ninth Day of April, 2013

Teresa Stanek Rea
*Acting Director of the United States Patent and Trademark Office*